(12) United States Patent
Kitabatake et al.

(10) Patent No.: US 12,721,211 B2
(45) Date of Patent: Aug. 25, 2026

(54) METHOD FOR PRODUCING WIRING BOARD

(71) Applicant: MITSUI MINING & SMELTING CO., LTD., Tokyo (JP)

(72) Inventors: Yukiko Kitabatake, Ageo (JP); Takenori Yanai, Ageo (JP); Yoshinori Matsuura, Ageo (JP)

(73) Assignee: MITSUI KINZOKU COMPANY, LIMITED, Tokyo (JP)

( * ) Notice: Subject to any disclaimer, the term of this patent is extended or adjusted under 35 U.S.C. 154(b) by 659 days.

(21) Appl. No.: 18/036,271

(22) PCT Filed: Aug. 6, 2021

(86) PCT No.: PCT/JP2021/029415

§ 371 (c)(1),
(2) Date: May 10, 2023

(87) PCT Pub. No.: WO2022/102182

PCT Pub. Date: May 19, 2022

(65) Prior Publication Data

US 2023/0420270 A1 Dec. 28, 2023

(30) Foreign Application Priority Data

Nov. 11, 2020 (JP) ................................ 2020-187948

(51) Int. Cl.
*H10W 74/01* (2026.01)
*B32B 43/00* (2006.01)

(52) U.S. Cl.
CPC ......... *H10W 74/019* (2026.01); *B32B 43/006* (2013.01); *B32B 2457/08* (2013.01)

(58) Field of Classification Search
None
See application file for complete search history.

(56) References Cited

U.S. PATENT DOCUMENTS

2003/0209788 A1 11/2003 Kobayakawa
2011/0248380 A1 10/2011 Yoshihara et al.
(Continued)

FOREIGN PATENT DOCUMENTS

JP 2005-101137 4/2005
JP 2011-228613 11/2011
(Continued)

*Primary Examiner* — Jay C Chang
(74) *Attorney, Agent, or Firm* — GREENBLUM & BERNSTEIN, P.L.C.

(57) ABSTRACT

There is provided a method for manufacturing a wiring substrate in which damage to a device layer during carrier release can be suppressed, and a photolithography process can be carried out with good accuracy on the device layer after carrier release. This method includes: providing a laminated sheet including a carrier, a release layer, a metal layer, and a device layer in order; making a cut line from a surface of the laminated sheet on the carrier side so that the cut line passes through the carrier, the release layer, and the metal layer when the laminated sheet is seen in a cross-sectional view; and removing outer edge portions outside the cut line in the carrier, the release layer, and the metal layer, thereby exposing part of a surface of the device layer on the metal layer side to form a pressurizable exposed portion for promoting release of the carrier.

18 Claims, 12 Drawing Sheets

(56) References Cited

U.S. PATENT DOCUMENTS

| | | | |
|---|---|---|---|
| 2019/0013212 | A1 | 1/2019 | Matsuura |
| 2019/0029125 | A1 | 1/2019 | Matsuura |
| 2019/0292415 | A1 | 9/2019 | Sato et al. |
| 2019/0378727 | A1* | 12/2019 | Matsuura .......... H01L 23/49838 |
| 2020/0045829 | A1 | 2/2020 | Matsuura et al. |
| 2020/0051847 | A1 | 2/2020 | Kiuchi et al. |
| 2020/0230936 | A1 | 7/2020 | Suzuki et al. |
| 2020/0266089 | A1* | 8/2020 | Shimokawa .......... H01L 21/568 |

FOREIGN PATENT DOCUMENTS

| | | |
|---|---|---|
| JP | 2011-238895 | 11/2011 |
| JP | 2014-72440 | 4/2014 |
| JP | 2015-35551 | 2/2015 |
| JP | 2020-27888 | 2/2020 |
| JP | 2020-119952 | 8/2020 |
| WO | 2017/150283 | 9/2017 |
| WO | 2017/150284 | 9/2017 |
| WO | 2018/066114 | 4/2018 |

* cited by examiner

METHOD FOR PRODUCING WIRING BOARD

TECHNICAL FIELD

The present invention relates to methods for manufacturing a wiring substrate.

BACKGROUND ART

In recent years, the multilayering of printed wiring boards has been widely performed in order to increase the mounting density of the printed wiring boards for size reduction.

Such multilayer printed wiring boards are utilized in many portable electronic apparatuses for the purpose of weight reduction and size reduction. Further reduction of the thicknesses of interlayer insulating layers, and still further weight reduction as wiring boards are required of these multilayer printed wiring boards.

As a technique for satisfying such requirements, a method for manufacturing a multilayer printed wiring board using a coreless build-up method is adopted. The coreless build-up method is a method of alternately laminating (building up) insulating layers and wiring layers for multilayering, without using a so-called core substrate. For the coreless build-up method, it is proposed to use a carrier-attached metal foil for easy release between a support and a multilayer printed wiring board. For example, Patent Literature 1 (JP2005-101137A) discloses a method for manufacturing a package substrate for semiconductor device mounting, comprising affixing an insulating resin layer to the carrier surface of a carrier-attached copper foil to form a support, forming a first wiring conductor on the superthin copper layer side of the carrier-attached copper foil by steps such as photoresist processing, pattern electrolytic copper plating, and resist removal, then forming build-up wiring layers, releasing the carrier-attached supporting substrate, and removing the superthin copper layer.

For the miniaturization of embedded circuits as shown in Patent Literature 1, a carrier-attached metal foil in which the thickness of a metal layer is 1 μm or less is desired. Accordingly, it is proposed to form a metal layer by a vapor phase method such as sputtering in order to achieve the reduction of the thickness of the metal layer. For example, Patent Literature 2 (WO2017/150283) discloses a carrier-attached copper foil in which a release layer, an antireflection layer, and a superthin copper layer (for example, a film thickness of 300 nm) are formed on a carrier such as a glass sheet by sputtering. Patent Literature 3 (WO2017/150284) discloses a carrier-attached copper foil in which intermediate layers (for example, an adhesion metal layer and a release-assisting layer), a release layer, and a superthin copper layer (for example, a film thickness of 300 nm) are formed on a carrier such as glass sheet by sputtering. Patent Literatures 2 and 3 also teach that intermediate layers composed of predetermined metals are interposed, and thus excellent stability of the mechanical release strength of the carrier is provided, and that the antireflection layer exhibits a desirable dark color, and thus visibility in image inspection (for example, automatic image inspection (AOI)) is improved.

Especially, with still further size reduction and power saving of electronic devices, the need for the high integration and thinning of semiconductor chips and printed wiring boards increases. As next-generation packaging techniques for satisfying such a need, the adoption of FO-WLP (Fan-Out Wafer Level Packaging) and PLP (Panel Level Packaging) has been studied in recent years. Also in FO-WLP and PLP, the adoption of the coreless build-up method is studied. One such method is a method referred to as an RDL-First (Redistribution Layer-First) method in which a wiring layer, and build-up wiring layers as needed, are formed on a coreless support surface, then chips are mounted and sealed, and subsequently the support is released. For example, Patent Literature 4 (JP2015-35551A) discloses a method for manufacturing a semiconductor apparatus, comprising the formation of a metal release layer on a major surface of a support composed of glass or a silicon wafer, the formation of an insulating resin layer on the metal release layer, the formation of a Redistribution Layer comprising build-up layers on the insulating resin layer, the mounting and sealing of semiconductor integrated circuits on the Redistribution Layer, the exposure of the release layer by the removal of the support, the exposure of secondary mounting pads by the removal of the release layer, and the formation of solder bumps on the surfaces of the secondary mounting pads, and secondary mounting.

Meanwhile, when a carrier is released from a wiring layer-attached carrier fabricated using a method such as the coreless build-up method, the wiring layer bends largely to cause the breaking of the wire and peeling off, and as a result, a decrease in the connection reliability of the wiring layer can occur. Accordingly, methods for removing a carrier that address such a problem are proposed. For example, Patent Literature 5 (JP2020-119952A) discloses a method of removing a carrier from a work (comprising, for example, a wiring layer in contact with a temporary adhesive layer, a plurality of chips bonded to the wiring layer, and a mold layer sealing the chips) provided on a surface of the carrier via the temporary adhesive layer. It is stated that in the method disclosed in Patent Literature 5, the carrier can be easily removed from the work by forming a height difference portion in which compared with the surface side of the carrier on which the work is provided, the bottom surface side of the carrier protrudes laterally, and applying downward force to the height difference portion in a state in which the work is maintained from above. Patent Literature 6 (JP2020-27888A) discloses that regarding a method of removing a carrier from a work provided on a surface of the carrier via a temporary adhesive layer, a cutting blade is allowed to cut from the work side along the outer peripheral edge of the carrier to a depth not reaching the bottom surface of the carrier to form a height difference portion in which the bottom surface side of the carrier protrudes more outward than the surface side.

CITATION LIST

Patent Literature

Patent Literature 1: JP2005-101137A
Patent Literature 2: WO2017/150283
Patent Literature 3: WO2017/150284
Patent Literature 4: JP2015-35551A
Patent Literature 5: JP2020-119952A
Patent Literature 6: JP2020-27888A

SUMMARY OF INVENTION

A photolithography process comprising the transfer of a circuit pattern by exposure may be performed on the surface of a wiring layer after a carrier is released. Here, in a general exposure apparatus, the corresponding size of a wafer, a panel, or the like on which exposure is performed is determined, and it is required to provide a wafer or the like whose size matches this corresponding size. In other words, when the size of a wafer or the like is out of a predetermined corresponding size (for example, smaller than the corresponding size), the displacement of alignment marks that are references for positioning before exposure occurs, and as a result, positioning is not suitably performed, which may hinder subsequent exposure. In this respect, in the methods for releasing a carrier disclosed in Patent Literatures 5 and 6, damage to a device layer (comprising, for example, a wiring layer, electronic devices (chips), and a mold layer) during carrier release is suppressed, but the methods involve the processing of the device layer itself, and as a result, the size necessarily decreases. Therefore, it is difficult to perform a photolithography process with good accuracy on the device layer after processing.

The present inventors have now found that by making a predetermined cut line in portions other than the device layer of a laminated sheet comprising a carrier, a release layer, a metal layer, and a device layer in order, and removing the outer edge portions outside this cut line to form a pressurizable exposed portion on the device layer, it is possible to manufacture a wiring substrate in which damage to the device layer during carrier release can be suppressed, and a photolithography process can be carried out with good accuracy on the device layer after carrier release.

Therefore, an object of the present invention is to provide a method for manufacturing a wiring substrate in which damage to a device layer during carrier release can be suppressed, and a photolithography process can be carried out with good accuracy on the device layer after carrier release.

According to an aspect of the present invention, there is provided a method for manufacturing a wiring substrate, comprising the steps of:

providing a laminated sheet comprising a release layer, a metal layer, and a device layer in order on a carrier;

making a cut line from a surface of the laminated sheet on the carrier side so that the cut line passes through an inside of a contour of the device layer and both ends thereof reach an end of the laminated sheet when the laminated sheet is seen in a planar view, and so as to pass through the carrier, the release layer, and the metal layer when the laminated sheet is seen in a cross-sectional view; and removing outer edge portions outside the cut line in the carrier, the release layer, and the metal layer, thereby exposing part of a surface of the device layer on the metal layer side to form a pressurizable exposed portion for promoting release of the carrier. According to another aspect of the present invention, there is provided a wiring substrate material comprising a release layer, a metal layer, and a device layer in order on a carrier, wherein outer edge portions of the carrier, the release layer, and the metal layer are missing in at least one place along at least one line passing through an inside of a contour of the device layer when the wiring substrate material is seen in a planar view, whereby part of a surface of the device layer on the metal layer side is exposed.

DESCRIPTION OF EMBODIMENTS

Method for Manufacturing Wiring Substrate

The present invention relates to a method for manufacturing a wiring substrate. The method of the present invention comprises the steps of (1) the provision of a laminated sheet, (2) the formation of cut lines, (3) the formation of pressurizable exposed portions, (4) the release of the carrier optionally performed, and (5) the removal of the metal layer optionally performed.

Each of the steps (1) to (5) will be described below with reference to the drawings.

(1) Provision of Laminated Sheet

Figure 1A:
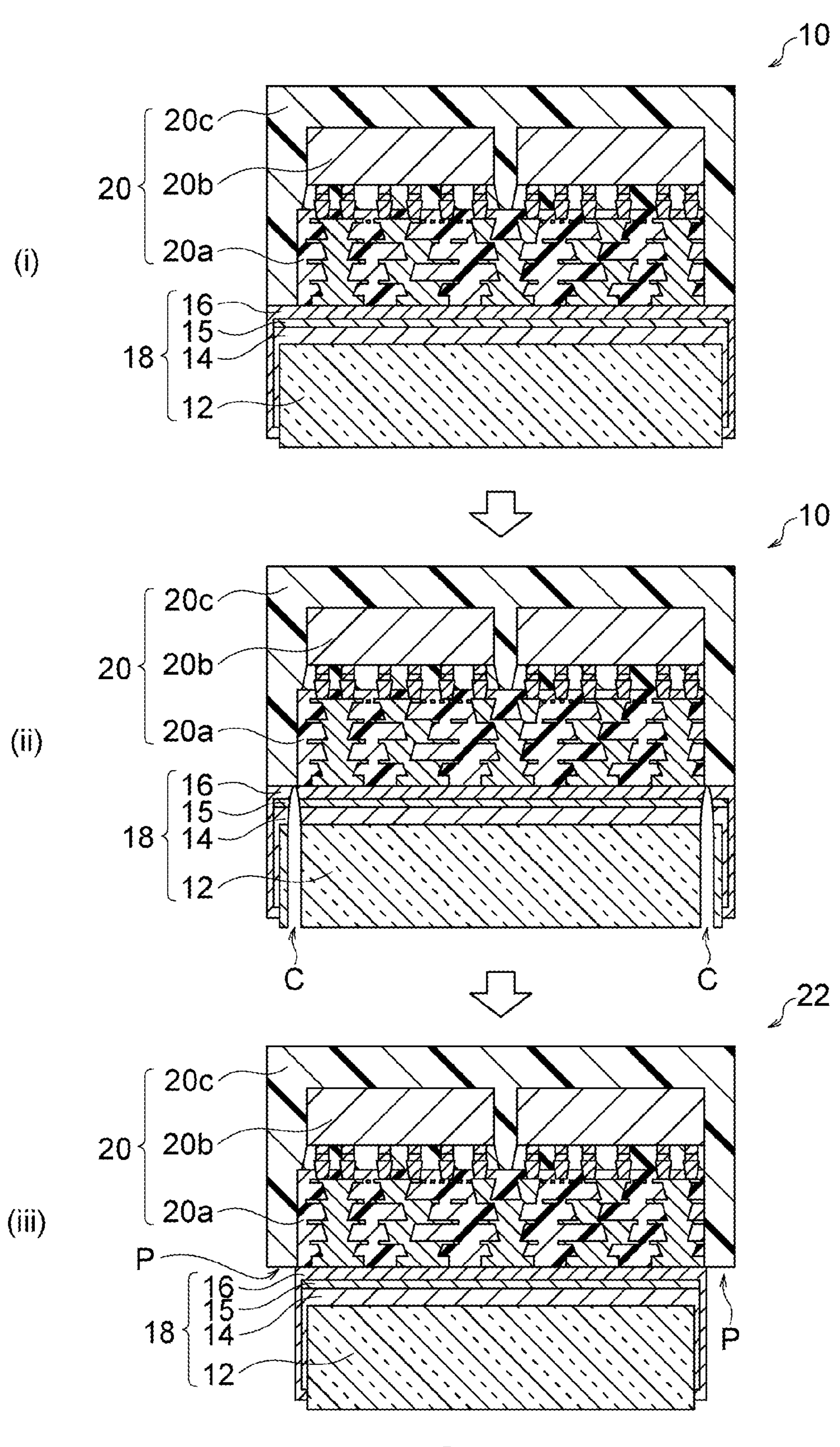
FIG. 1A is a process flow chart showing in a schematic cross-sectional view of one example of a method for manufacturing a wiring substrate according to the present invention.
Figure 1B:
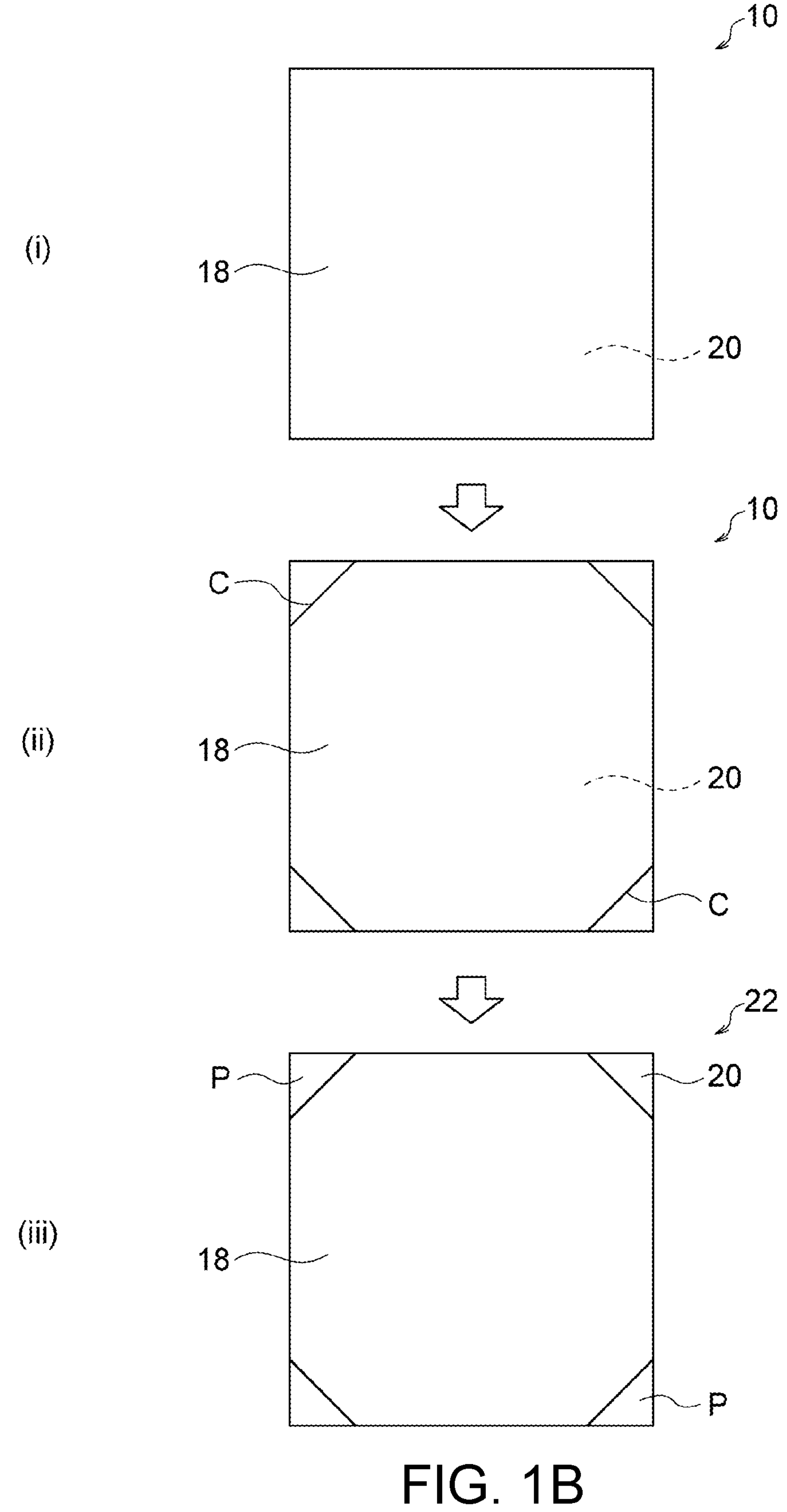
FIG. 1B is a process flow chart showing steps corresponding to FIG. 1A in a schematic top view in which a laminated sheet is seen from the carrier side.

One example of the method for manufacturing a wiring substrate according to the present invention is shown in FIGS. 1A and 1B. First, as shown in FIG. 1A(i), a laminated sheet 10 comprising a release layer 15, a metal layer 16, and a device layer 20 in order on a carrier 12 is provided. The release layer 15 is a layer provided on the carrier 12 and contributing to release between the carrier 12 and the metal layer 16. The metal layer 16 is a layer composed of a metal provided on the release layer 15. The device layer 20 is a layer having a device function provided on the metal layer 16.

The laminated sheet 10 may further have an intermediate layer 14 between the carrier 12 and the release layer 15. Each of the intermediate layer 14, the release layer 15, and the metal layer 16 may be a single layer composed of one layer or a multilayer composed of two or more layers.

The carrier 12 may be composed of any of glass, ceramic, silicon, a resin, and a metal but is preferably a glass carrier, a single crystal silicon carrier, or a polycrystalline silicon carrier. According to a preferred aspect of the present invention, the carrier 12 has a disk shape having a diameter of 100 mm or more, more preferably a disk shape having a diameter of 200 mm or more and 450 mm or less. According to another preferred aspect of the present invention, the carrier 12 has a rectangular shape having a short side of 100 mm or more, more preferably a rectangular shape having a short side of 150 mm or more and 600 mm or less and a long side of 200 mm or more and 650 mm or less.

The device layer 20 preferably comprises a wiring layer 20*a,* electronic devices 20*b* provided on the wiring layer 20*a,* and a mold layer 20*c* surrounding at least the electronic devices 20*b,* and more preferably, the mold layer 20*c* surrounds the wiring layer 20*a* and the electronic devices 20*b*. However, the device layer 20 may be mainly composed of the wiring layer 20*a* and not comprise the electronic devices 20*b* and/or the mold layer Preferably, the laminated sheet 10 can be provided as follows. First, a carrier-attached metal foil 18 comprising an optionally provided intermediate layer 14 (that is, an optional 20 layer), the release layer 15, and the metal layer 16 on the carrier 12 is provided. Then, a first wiring layer is formed on the surface of the metal layer 16. Subsequently, the device layer 20 is built based on the first wiring layer. The formation of the first wiring layer and the building of the device layer 20 should be performed by a known method, and, for example, the above-described coreless build-up method can be preferably adopted. In the following description, the carrier 12, the intermediate layer 14 (when present), the release layer 15, and the metal layer 16 may be collectively referred to as "the carrier-attached metal foil 18". A preferred aspect of the carrier-attached metal foil 18 will be described later.

Figure 2:
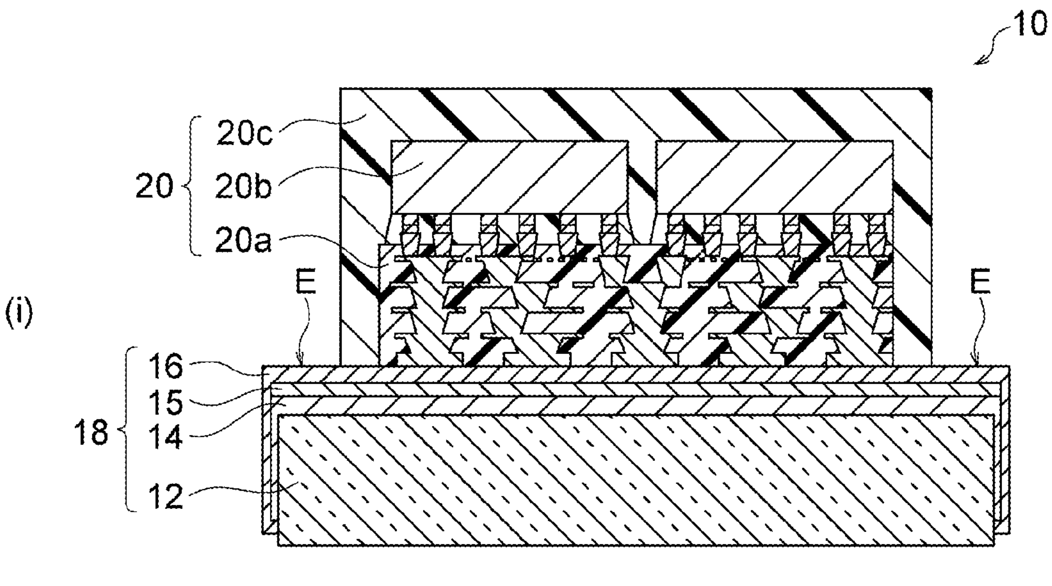
FIG. 2 is a view showing one example of the step of previously cutting the extending portion of a metal layer along the contour of a device layer and corresponds to a step before the step shown in FIG. 1A(ii).
Figure 2:
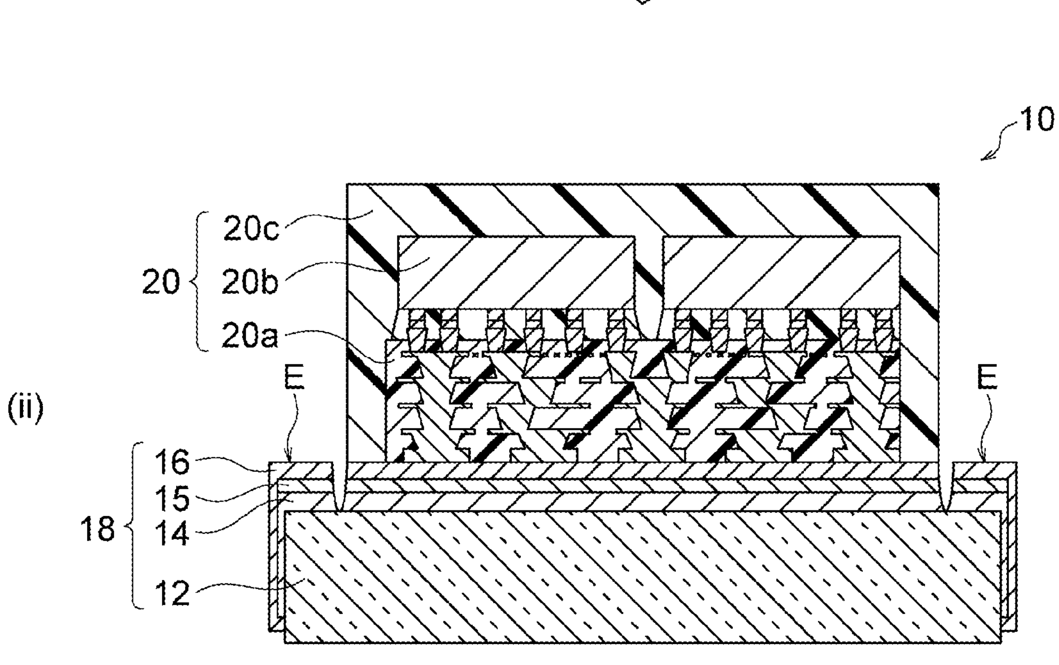

The laminated sheet 10 may have an extending portion E in which the metal layer 16 projects from the end of the device layer 20 when the laminated sheet 10 is seen in a planar view. In this case, as shown in FIGS. 2(*i*) and 2(*ii*), the metal layer 16 (optionally further the release layer 15 and the intermediate layer 14 (when present)) is preferably previously cut along the contour of the device layer 20 in the extending portion E before cut lines C described later are made. Thus, the carrier-attached metal foil 18 can be still more easily and reliably released from the device layer 20.

(2) Formation of Cut Lines

The cut lines C are made from the surface of the provided laminated sheet 10 on the carrier 12 side. These cut lines C are made in the laminated sheet 10 so as to pass through the carrier 12, the intermediate layer 14 (when present), the release layer 15, and the metal layer 16 when the laminated sheet 10 is seen in a cross-sectional view, as shown in FIG. 1A(ii). At this time, the cut lines C are made so that the cut lines C pass through the inside of the contour of the device layer 20 and both ends thereof (that is, both ends of the cut lines C) reach the ends of the laminated sheet 10 when the laminated sheet 10 is seen in a planar view, as shown in FIG. 1B(ii). By making such cut lines C in the laminated sheet 10, the outer edge portions outside the cut lines C in the carrier-attached metal foil 18 are cut off from the portion inside the cut lines C. As a result, in the step of forming pressurizable exposed portions P described later, the outer edge portions outside the cut lines C in the carrier-attached metal foil 18 can be removed. For the method for forming the cut lines C, a known method should be adopted, and the method for forming the cut lines C is not particularly limited. For example, the cut lines C can be made in the laminated sheet 10 using a cutting tool such as a cutter, or a machine tool such as a cutting blade.

Figure 3A:
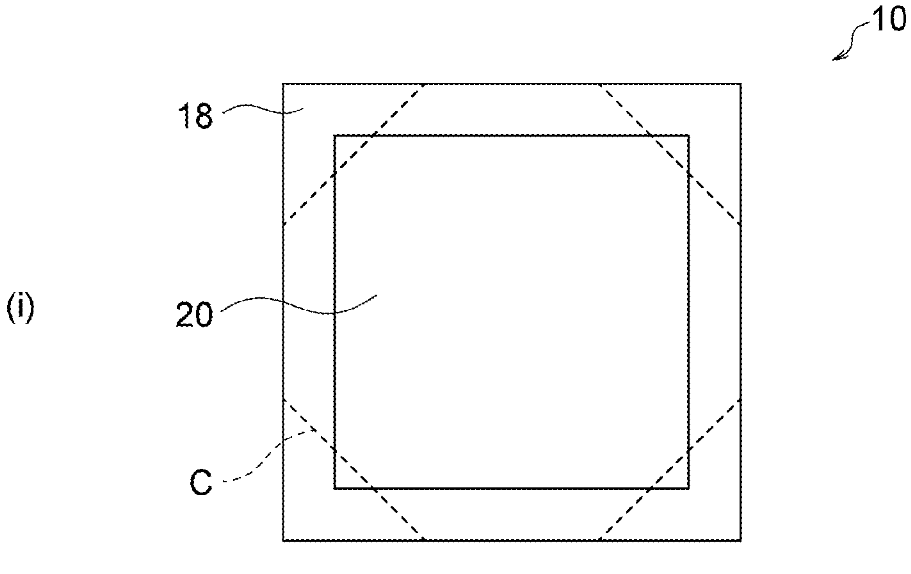
FIG. 3A is a top view showing (i) one example of the positions of cut lines and (ii) a state after the outer edge portions outside the cut lines are removed, in a laminated sheet having a rectangular shape.
Figure 3A:
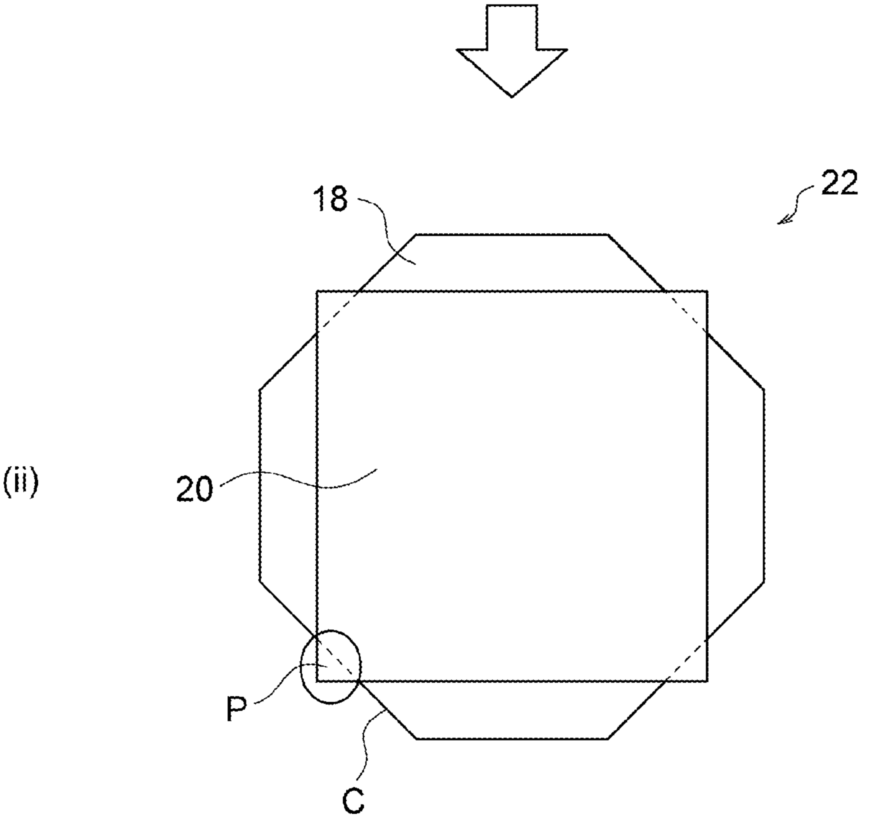
Figure 3B:
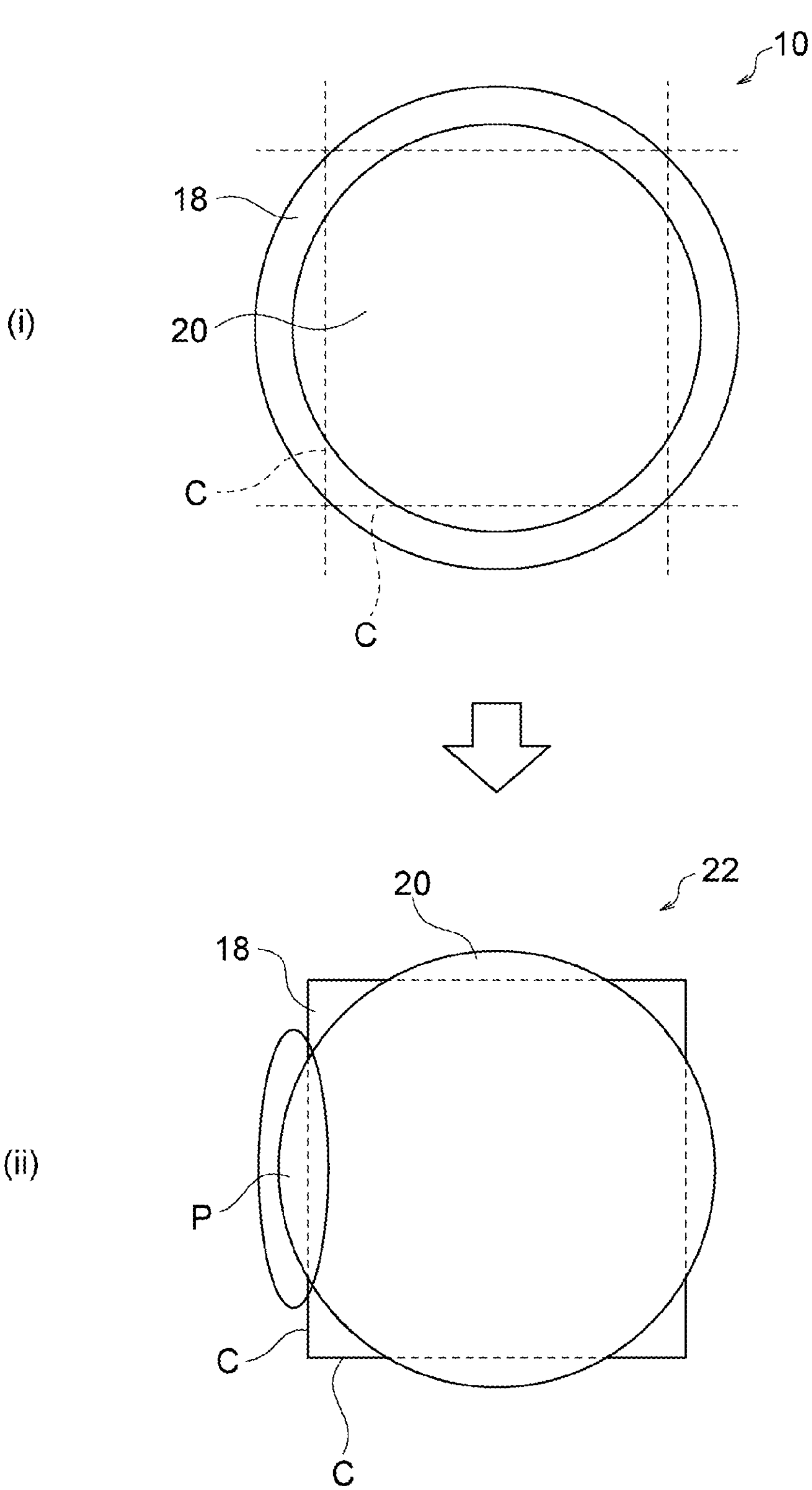
FIG. 3B is a top view showing (i) one example of the positions of cut lines and (ii) a state after the outer edge portions outside the cut lines are removed, in a laminated sheet having a disk shape.

In the laminated sheet 10, the cut lines C are preferably provided so that the pressurizable exposed portions P described later have a polygonal shape or an arc shape. Here, FIGS. 3A and 3B show (i) one example of the positions of the cut lines C and (ii) a state after the outer edge portions outside the cut lines C are removed, in a laminated sheet having a rectangular shape (oblong or square shape) (FIG. 3A) and a laminated sheet having a disk shape (wafer shape) (FIG. 3B). When the laminated sheet 10 has a rectangular shape, for example, the pressurizable exposed portions P having a triangular shape can be formed by making the cut lines C in the carrier-attached metal foil 18 along the dotted lines shown in FIG. 3A(i) from the carrier 12 side using a cutting blade (FIG. 3A(ii)). When the laminated sheet 10 has a disk shape, for example, the pressurizable exposed portions P having an arc shape can be formed by making the cut lines C in the carrier-attached metal foil 18 along the dotted lines shown in FIG. 3B(i) from the carrier 12 side using a cutting blade (FIG. 3B(ii)).

In the laminated sheet 10, the pressurizable exposed portions P described later are preferably formed in at least two places in the device layer 20 by providing the cut lines C in at least two places, from the viewpoint of being able to effectively suppress damage to the wiring layer 20*a* and the electronic devices 20*b* during the release of the carrier 12. For example, when the laminated sheet 10 has a rectangular shape, the cut lines C are preferably provided so as to cut off two corners on a diagonal line (or four corners on diagonal lines) in the carrier-attached metal foil 18 and the device layer 20, as shown in FIG. 3A(i). When the laminated sheet 10 has a disk shape, the cut lines C are preferably provided along two straight lines parallel to each other passing through both the carrier-attached metal foil 18 and the device layer 20 (or further two straight lines perpendicular to the two straight lines), as shown in FIG. 3B(i). The upper limit of the number of places in which the cut lines C (and the pressurizable exposed portions P) are provided in the laminated sheet 10 is not particularly limited but is typically four places or less.

When the device layer 20 comprises the wiring layer 20*a,* the electronic devices 20*b* provided on the wiring layer 20*a,* and the mold layer 20*c* surrounding the wiring layer 20*a* and the electronic devices 20*b,* the cut lines C are preferably provided so as to cross the mold layer 20*c* without crossing the wiring layer 20*a* and the electronic devices 20*b* when the laminated sheet 10 is seen in a planar view. Thus, the pressurizable exposed portions P described later can be formed on portions consisting of the mold layer 20*c,* and therefore damage to the wiring layer 20*a* and the electronic devices 20*b* during the release of the carrier 12 can be effectively suppressed. From such a viewpoint, the cut lines C are preferably provided so as to pass through regions 0.5 mm or more and 30.0 mm or less, more preferably 1.0 mm or more and 15.0 mm or less, and further preferably 1.5 mm or more and 5.0 mm or less inside the contour of the device layer 20 when the laminated sheet 10 is seen in a planar view.

(3) Formation of Pressurizable Exposed Portions

The outer edge portions outside the cut lines C in the carrier 12, the intermediate layer 14 (when present), the release layer 15, and the metal layer 16 are removed from the laminated sheet 10 in which the cut lines C are formed. Thus, parts of the surface of the device layer 20 on the metal layer 16 side can be exposed to form the pressurizable exposed portions P, as shown in FIG. 1A(iii) and FIG. 1B(iii). The pressurizable exposed portions P are parts in which force can be directly applied to the device layer 20 in order to promote the release of the carrier 12. "Pressurization" herein means applying force to an article (object) and includes the meanings of both "pushing" and "pulling" an article (object). In the following description, the laminated sheet 10 in which the pressurizable exposed portions P are provided on the device layer 20 may be referred to as a "wiring substrate 22" or a "wiring substrate material".

As described above, a photolithography process comprising the transfer of a circuit pattern by exposure may be performed on the surface of the device layer 20 (comprising, for example, the wiring layer 20*a*) after the carrier 12 is released. Here, in a general exposure apparatus, the corresponding size of a wafer, a panel, or the like on which exposure is performed is determined, and it is required to provide a wafer or the like whose size matches this corresponding size. In other words, when the size of a wafer or the like is out of a predetermined corresponding size (for example, smaller than the corresponding size), the displacement of alignment marks that are references for positioning before exposure occurs, and as a result, positioning is not suitably performed, which may hinder subsequent exposure.

Figure 5:
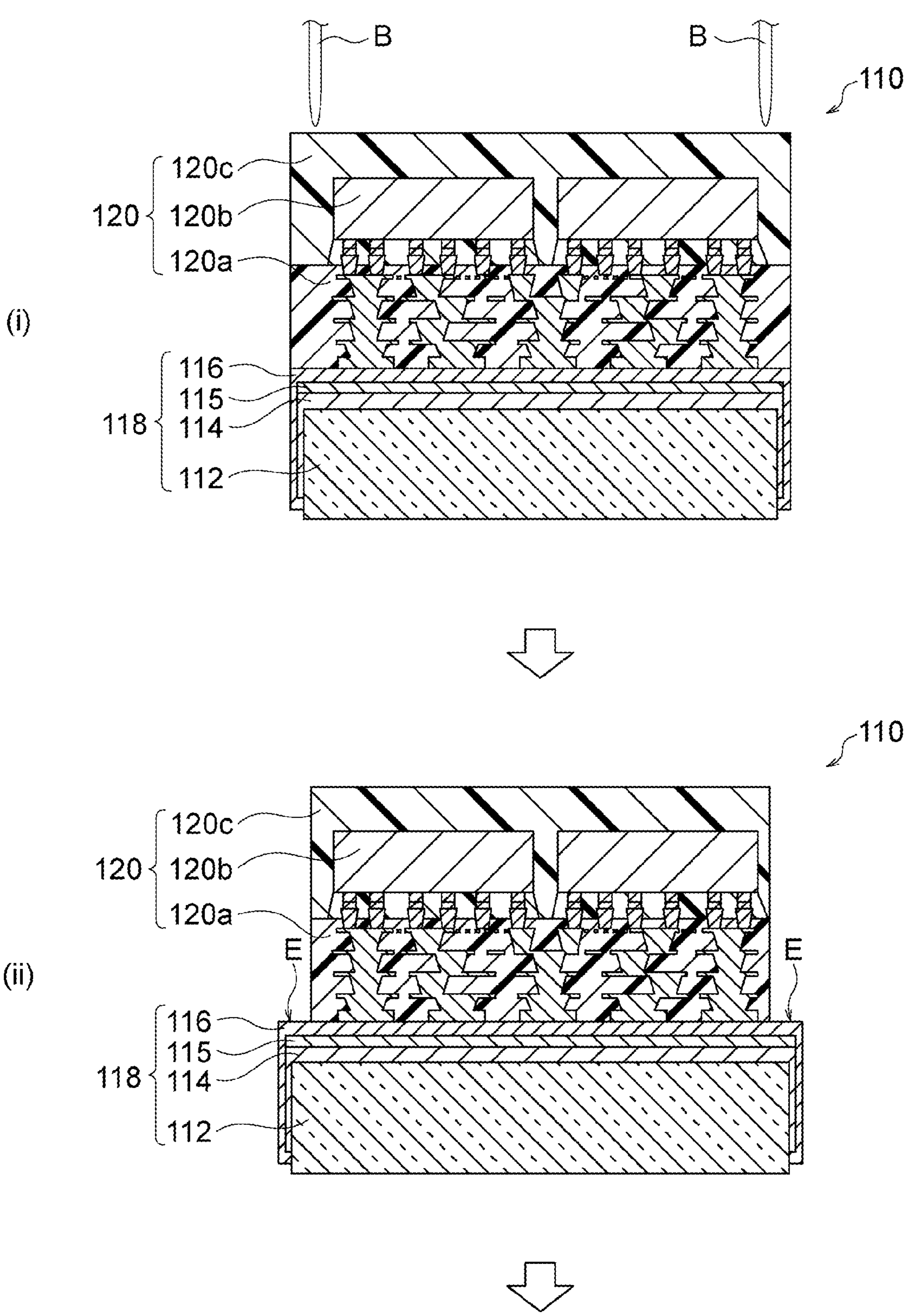
FIG. 5 is a process flow chart showing in a schematic cross-sectional view one example of a conventional method for manufacturing a wiring substrate and corresponds to the first half step (steps (i) and (ii)).
Figure 6:
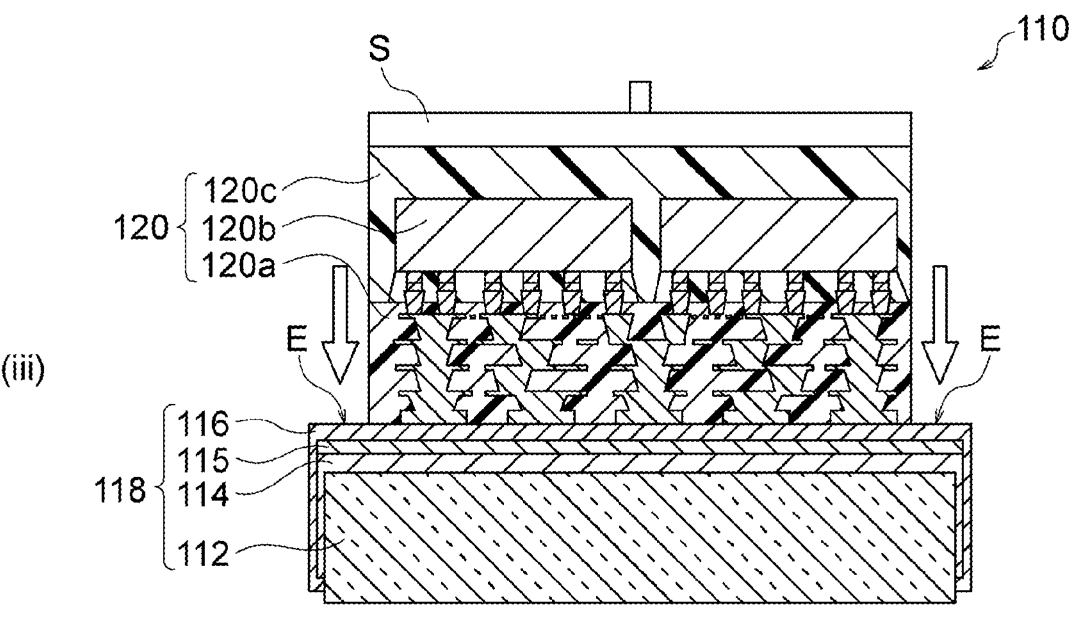
FIG. 6 is a process flow chart showing in a schematic cross-sectional view of the one example of the conventional method for manufacturing a wiring substrate and corresponds to the second half step (steps (iii) and (iv)) following the step shown in FIG.
Figure 6:
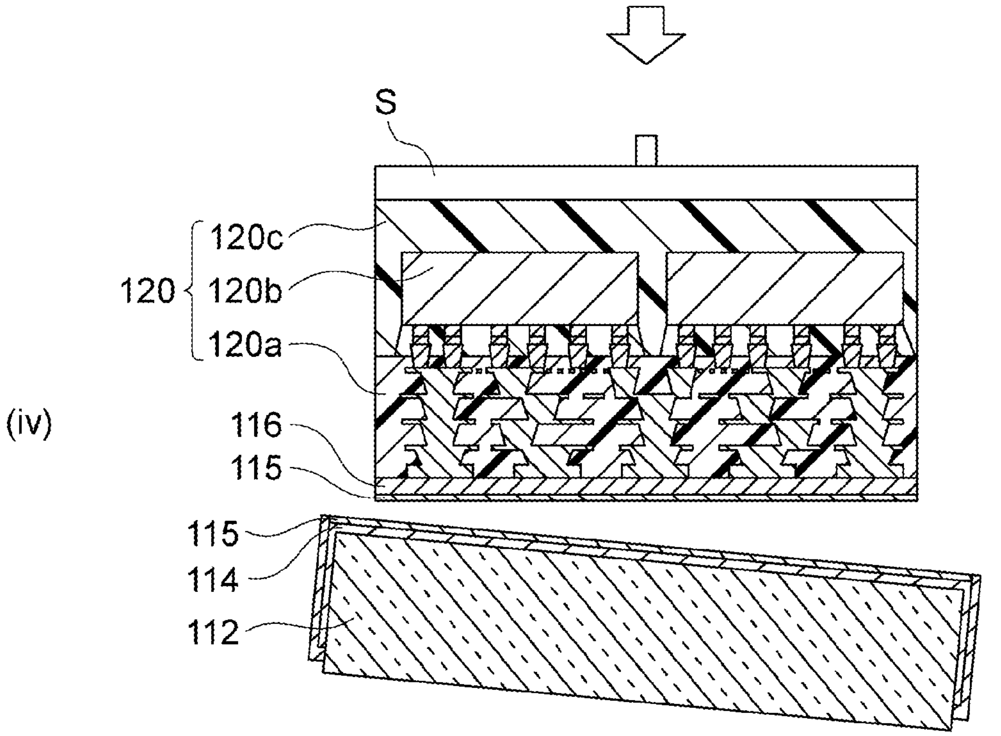

In this respect, for the conventional methods as disclosed in Patent Literatures 5 and 6, it is difficult to perform a photolithography process with good accuracy on a device layer comprising a wiring layer and the like after carrier release. Here, in FIGS. 5 and 6, one example of a conventional method for manufacturing a wiring substrate is shown. In the conventional process shown in FIGS. 5 and 6, first, a laminated sheet 110 in which a device layer 120 is provided on a carrier-attached metal foil 118 is provided (the step (i) in FIG. 5). In this example, the carrier-attached metal foil 118 comprises an intermediate layer 114, a release layer 115, and a metal layer 116 in order on a carrier 112. The device layer 120 comprises a wiring layer 120*a*, electronic devices 120*b*, and a mold layer 120*c*. Then, a cut reaching the carrier-attached metal foil 118 is made from the device layer 120 side of the provided laminated sheet 110 using a cutting blade B, and the outer edge portion outside the cut in the device layer 120 is removed to form an extending portion E (the step (ii) in FIG. 5). Subsequently, force is applied to the formed extending portion E in the direction in which the carrier 112 is pulled away from the device layer 120, in a state in which the device layer 120 is fixed by a suction apparatus S (the step (iii) in FIG. 6). Thus, the carrier 112 and the intermediate layer 114 are released from the device layer 120 at the position of the release layer 115 (the step (iv) in FIG. 6).

In this manner, in the conventional method for manufacturing a wiring substrate, the outer edge portion of the device layer 120 (for example, a portion outside a position 0.2 mm or more and 5 mm or less from the contour of the device layer 120) is removed. Therefore, even if the size of the device layer 120 before processing matches the corresponding size of an exposure apparatus (for example, a disk shape having a diameter of 300 mm), the size of the device layer 120 after processing (for example, a disk shape having a diameter of 295 mm) is smaller than the corresponding size of the exposure apparatus. Therefore, when a photolithography process is performed on the device layer 120 after carrier 112 release, the displacement of alignment marks occurs due to the difference in size between the device layer 120 and the exposure apparatus, and as a result, positioning before exposure may not be suitably performed. Therefore, in the conventional method for manufacturing a wiring substrate, it is difficult to perform a photolithography process with good accuracy on the device layer after carrier release.

In contrast to this, in the method of the present invention, the pressurizable exposed portions P are formed by processing the carrier 12, the intermediate layer 14 (when present), the release layer 15, and the metal layer 16 in the laminated sheet 10, and therefore the size of the device layer 20 is maintained. Therefore, positioning before exposure based on alignment marks is suitably performed on the device layer 20 after the carrier 12 is released. As a result, a photolithography process can be carried out with good accuracy. Moreover, in the release of the carrier 12, the carrier 12 can be easily released by applying moderate force to the pressurizable exposed portions P, and therefore damage to the device layer 20 can be suppressed. Another advantage is that the release and removal of the carrier 12 can be simply performed by physical release, and therefore a release method involving a step such as immersion in a solution for dissolving the release layer or laser irradiation need not be adopted.

(4) Release of Carrier (Optional Step)

Figure 4:
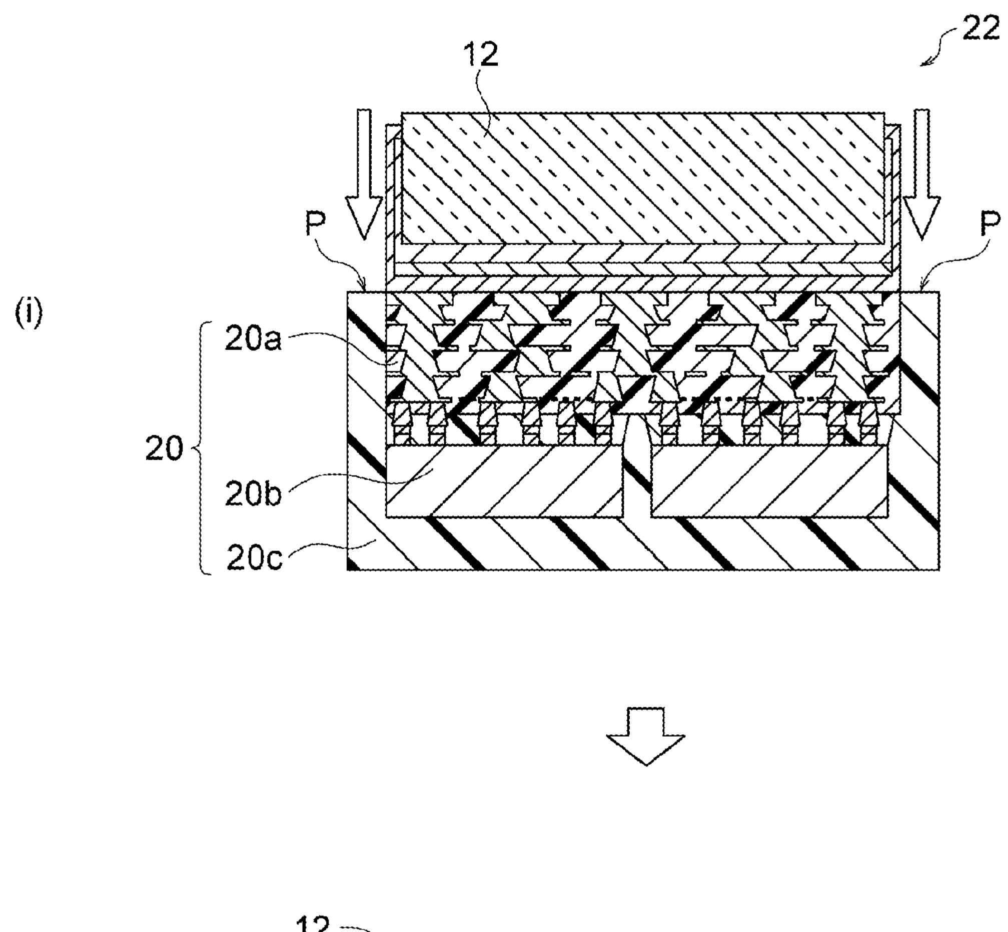
FIG. 4 is a view showing one example of the step of releasing a carrier from a laminated sheet and corresponds to a step after the step shown in FIG. 1A(iii).
Figure 4:
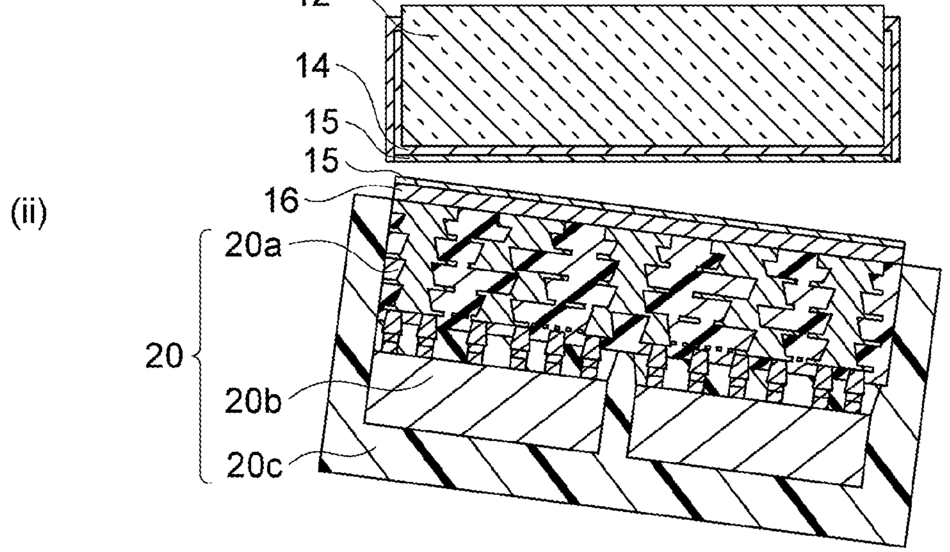

Optionally, after the outer edge portions of the carrier-attached metal foil 18 are removed, the carrier 12 and the intermediate layer 14 (when present) are released from the wiring substrate 22 at the position of the release layer 15. At this time, the wiring substrate 22 has the pressurizable exposed portions P, and thus the carrier 12 can be easily released. Here, in FIG. 4, one example of the step of releasing the carrier 12 is shown. As shown in FIGS. 4(*i*) and 4(*ii*), the release of the carrier 12 and the like is preferably performed by applying force to the pressurizable exposed portions P of the device layer 20 in the direction in which the device layer 20 is pulled away from the carrier 12 (the direction shown by the arrows in FIG. 4(*i*)), in a state in which the carrier 12 is fixed. The pressurization method for the pressurizable exposed portions P is not particularly limited, and the hands, a tool, a machine, or the like can be used. For example, the carrier 12 can be released by pressing the pressurizable exposed portions P using a pressing member, or hooking hook members on the pressurizable exposed portions P and pulling the pressurizable exposed portions P in the direction in which the device layer 20 is pulled away from the carrier 12.

When the carrier is a single crystal silicon carrier in this release step, the direction of the progress of the release is preferably noted. Here, the steps of releasing the carrier 12 when the carrier 12 of the carrier-attached metal foil 18 is a single crystal silicon carrier are shown in FIGS. 7A, 7B, 8A, and 8B. In the steps shown in FIGS. 7A to 8B, the carrier-attached metal foil 18 in which the carrier 12 is a single crystal silicon carrier is provided (FIG. 7A(i) and FIG. 8A(i)), and after the device layer 20 is formed on the metal layer 16 of the carrier-attached metal foil 18 (FIG. 7A(ii) and FIG. 8A(ii)), the release of the carrier 12 is performed (FIGS. 7B(iii) and 7B(iv) and FIGS. 8B(iii) and 8B(iv)).

Figure 7A:
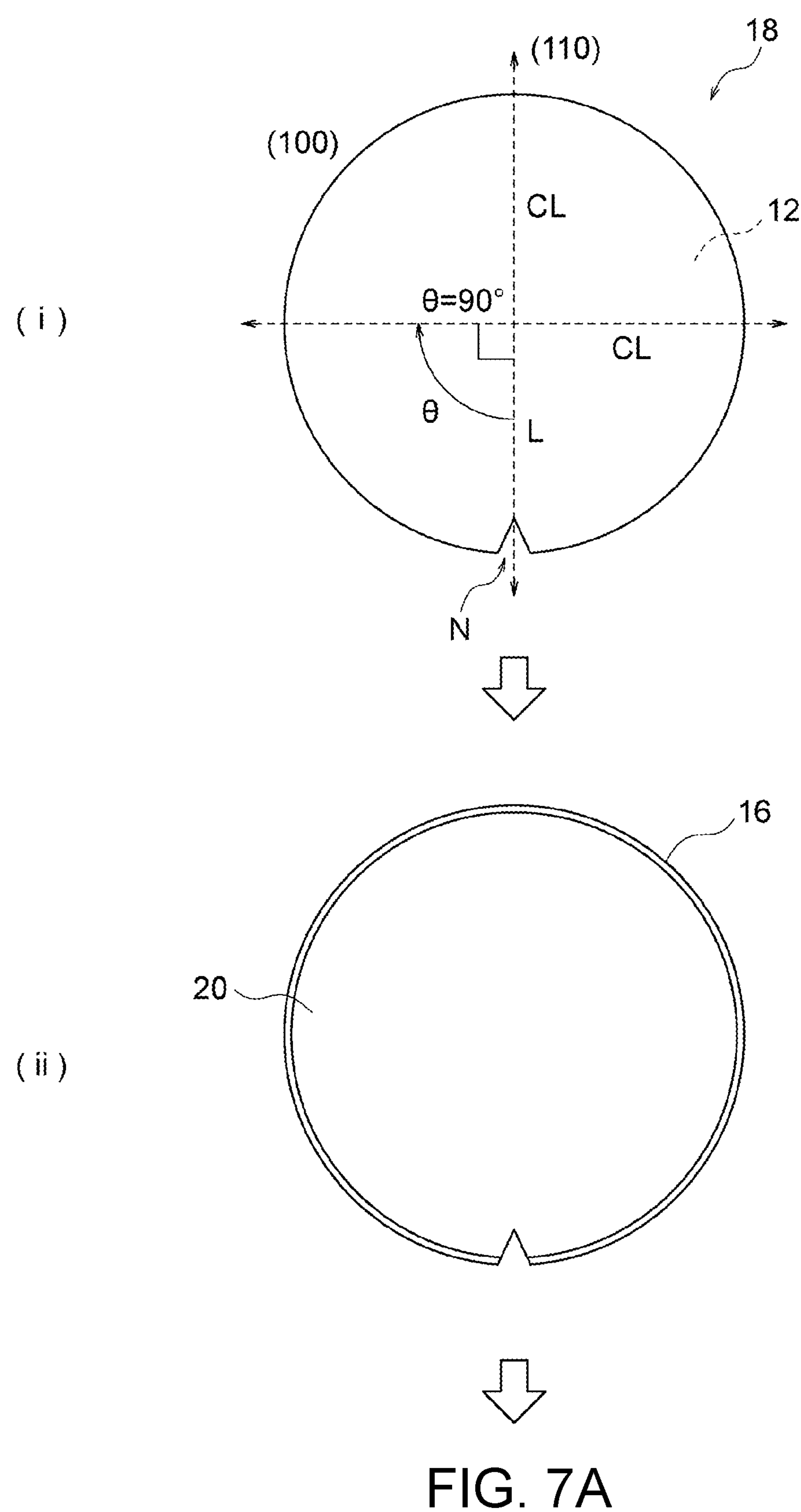
FIG. 7A is a process flow chart showing in a top view a case where when a carrier is a silicon wafer, a direction in which external stress due to release progresses matches cleavage orientation, and the silicon wafer cracks, and FIG. 7A corresponds to the first half step (steps (i) and (ii)).
Figure 7B:
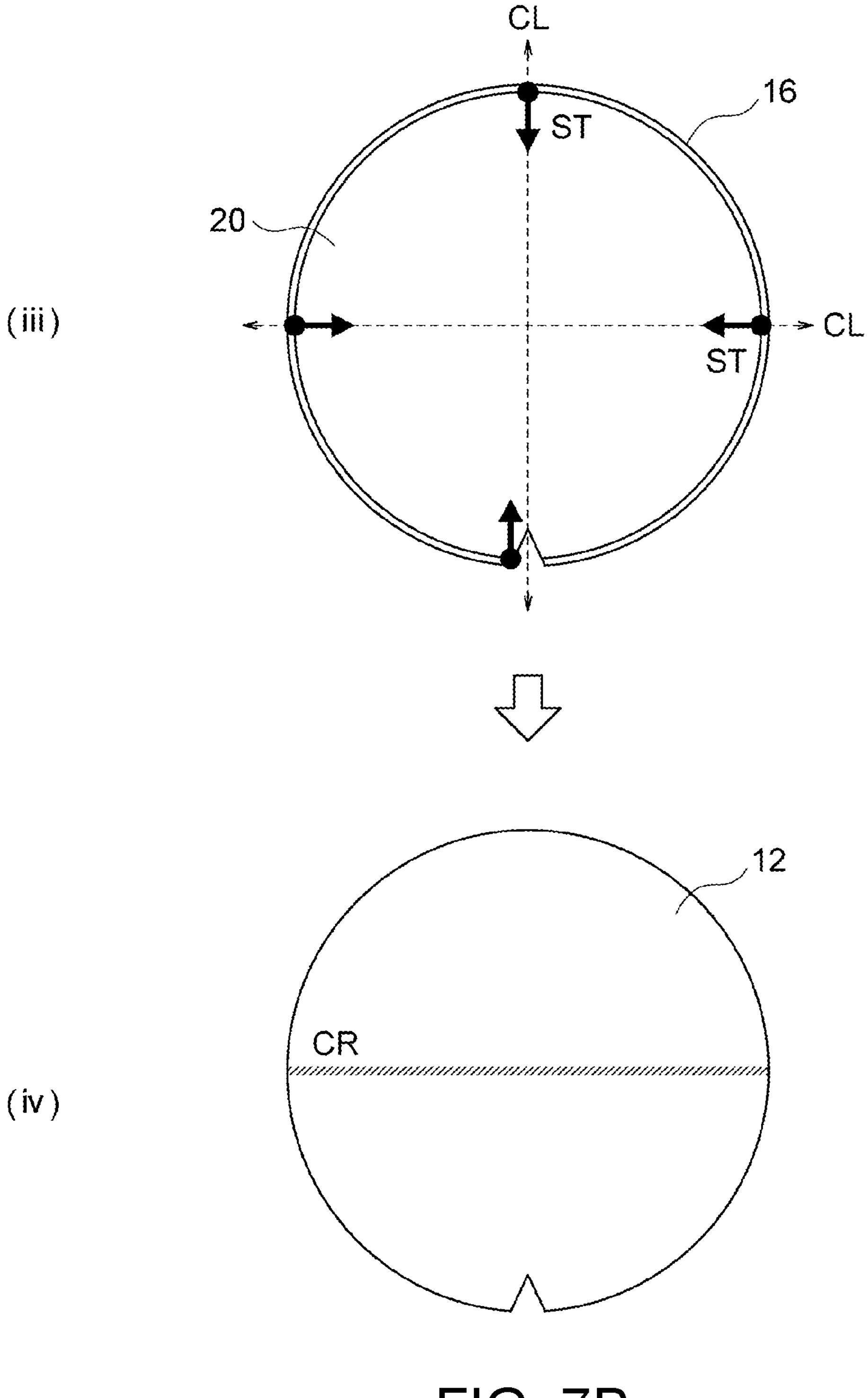
FIG. 7B is a process flow chart showing in a top view the case where when a carrier is a silicon wafer, a direction in which external stress due to release progresses matches cleavage orientation, and the silicon wafer cracks, and FIG. 7B corresponds to the second half step (steps (iii) and (iv)) following the step shown in FIG. 7A.
Figure 8A:
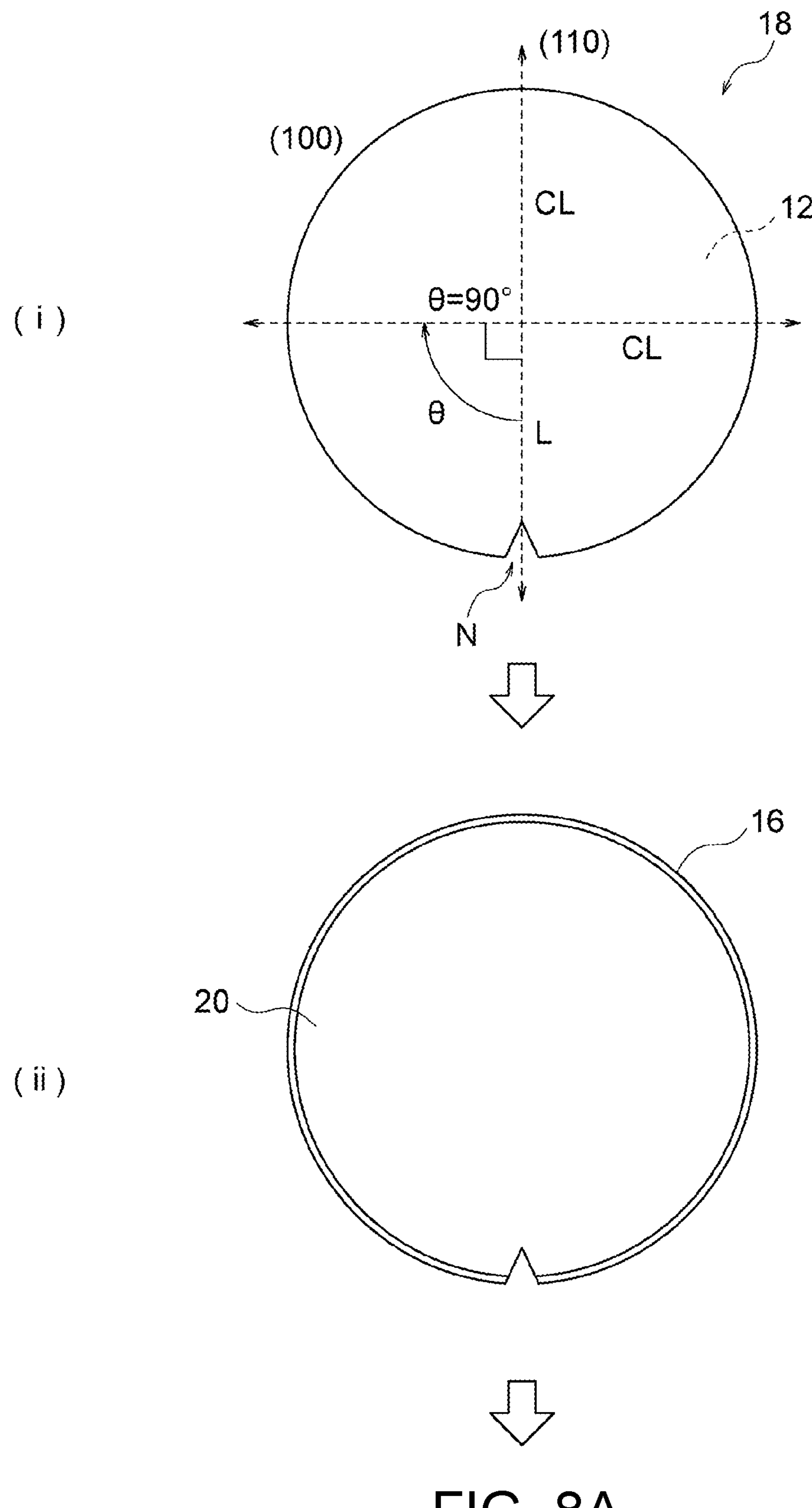
FIG. 8A is a process flow chart showing in a top view a case where when a carrier is a silicon wafer, the direction in which external stress due to release progresses mismatches cleavage orientation, and a crack in the silicon wafer is suppressed, and FIG. 8A corresponds to the first half step (steps (i) and (ii)).
Figure 8B:
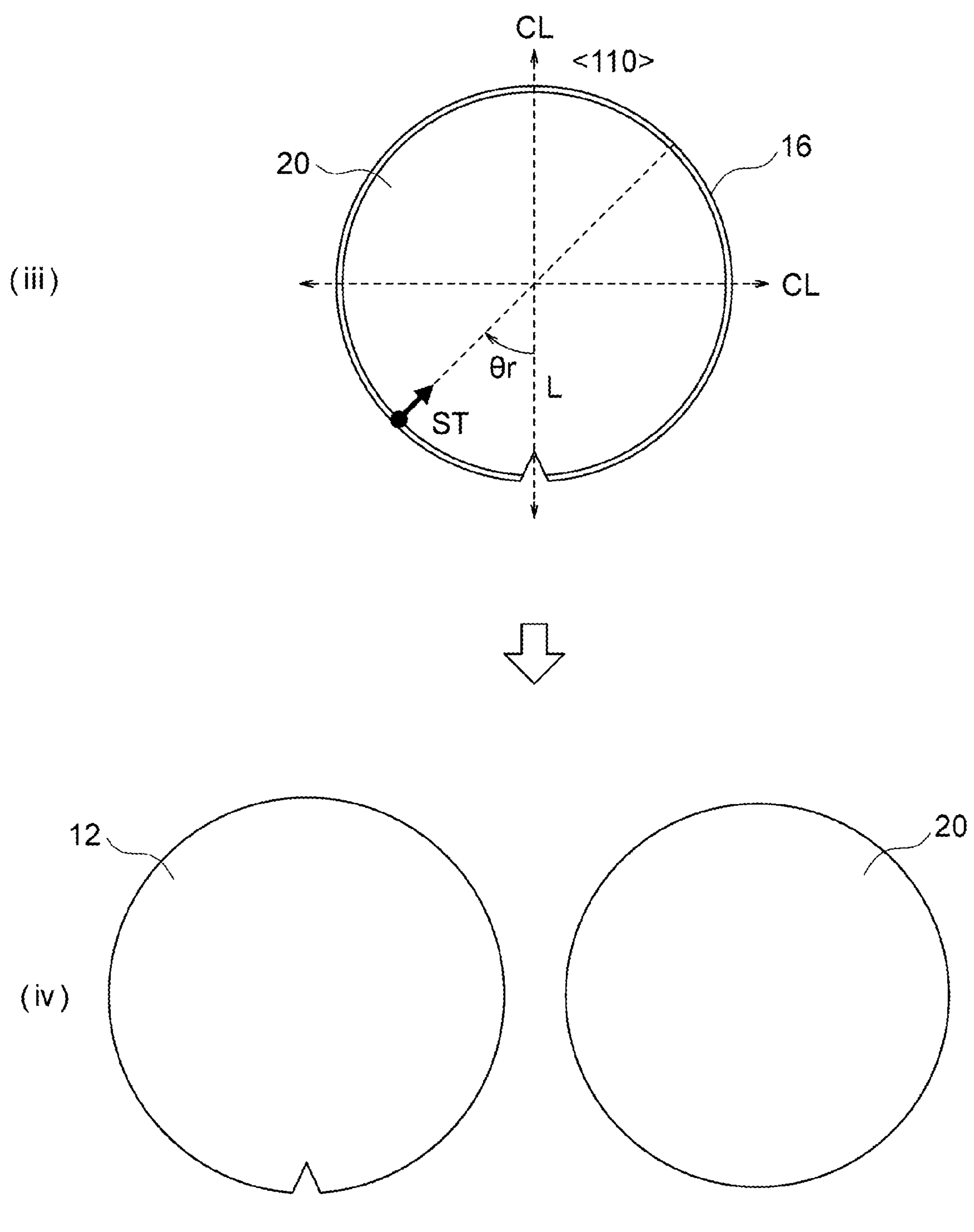
FIG. 8B is a process flow chart showing in a top view the case where when a carrier is a silicon wafer, the direction in which external stress due to release progresses mismatches cleavage orientation, and a crack in the silicon wafer is suppressed, and corresponds to the second half step (steps (iii) and (iv)) following the step shown in FIG. 8A.

As shown in FIGS. 7B(iii) and 7B(iv), when release is performed in directions in which a direction in which external stress ST progresses matches cleavage orientation CL, there is a possibility of the breakage of the silicon carrier, such as the occurrence of a crack CR along the cleavage orientation CL starting from the point to which the external stress ST due to the first release is applied. In order to suppress such breakage of the silicon carrier due to cleavage, when the carrier 12 is a single crystal silicon carrier, the external stress ST is preferably applied so as to mismatch both directions of the cleavage orientation CL on the x axis (the horizontal direction in the figure) and the y axis (the vertical direction in the figure) on the silicon carrier, to perform the release of the carrier 12, as shown in FIGS. 8B(iii) and 8B(iv).

A more specific description will be given. As shown in FIG. 7A(i) and FIG. 8A(i), when an angle $\theta$ is defined right-handed (clockwise) starting from a half line L from the center of the carrier 12 to a notch N, $\theta=0°$, 90°, 180°, and 270° correspond to the cleavage orientation CL. Therefore, for the direction of the progress of the external stress ST due to release, $\theta r$, release is preferably performed while the direction of the progress of the external stress ST is maintained so that $\theta r$ is within the range of $1°<\theta r<89°$, more preferably within the range of $5°<\theta r<85°$, as shown in FIG. 8B(iii). The release method satisfying such a range of $\theta r$ allows the suppression of the breakage of the carrier 12 composed of a silicon wafer. Particularly preferred ranges of $\theta r$ in this release are $\theta r=45\pm10°$, $135\pm10°$, $225\pm10°$, and/or $315\pm10°$ right-handed starting from the half line L. At these angles, the wafer is least likely to cleave in the crystal orientation <100> direction of the silicon wafer. Therefore, by progressing the external stress at these angles, the removal of the carrier can be performed while the breakage of the wafer is effectively suppressed. It is preferred that in order to set the direction of the progress of the external stress ST, $\theta r$, at the angles, the pressurizable exposed portions P are formed at $\theta r=45\pm10°$, $135\pm10°$, $225\pm10°$, and/or $315\pm10°$, and then the release of the carrier 12 is performed.

When the pressurizable exposed portions P are formed in at least two places, the release of the carrier 12 is preferably performed by applying force to the pressurizable exposed portions P in the at least two places in the direction in which the device layer 20 is pulled away from the carrier 12. Thus, compared with the case of the pressurizable exposed portion P in only one place, the force applied to the pressurizable exposed portions P can be dispersed, and as a result, damage to the device layer 20 can be still more effectively suppressed. In order to further enhance this effect, the release of the carrier 12 is preferably performed by applying force in the direction in which the device layer 20 is pulled away in the direction perpendicular to the surface defined by the carrier 12 (carrier surface).

Typically, the elastic modulus of the device layer 20 can be lower than the elastic modulus of the carrier 12. For example, the elastic modulus of the device layer 20 is less than 1 time, more typically less than 0.7 times, and more preferably less than 0.5 times the elastic modulus of the carrier 12. Examples of this aspect include a case where the device layer 20 (for example, the mold layer 20*c*) comprises a resin. In this case, before the carrier 12 and the like are released, a reinforcing material is preferably allowed to abut the surface of the device layer 20 opposite to the metal layer 16, and/or the exposed end of the device layer 20. Thus, the release of the carrier 12 can be more smoothly performed, and damage to the device layer 20 during carrier 12 release can be still further reduced. The abutment of a reinforcing material may be performed by adhering (for example, adhering using an adhesive or a pressure-sensitive adhesive tape) a reinforcing material to the device layer 20 or by simply adhering a reinforcing material to the device layer 20 without using an adhesive or the like. The reinforcing material is preferably composed of a metal, a rubber (for example, a silicone rubber), a resin (for example, an epoxy resin), or a combination thereof. When a reinforcing material is allowed to abut the surface of the device layer 20 opposite to the metal layer 16, the entire surface may be allowed to abut a reinforcing material (for example, a reinforcing material having no rigidity, such as a silicone rubber), or part of the surface may be allowed to abut a reinforcing material (for example, a reinforcing material having rigidity, such as a metal plate) so that at least the wiring layer 20*a* and the electronic devices 20*b* are covered when the wiring substrate 22 is seen in a planar view.

Alternatively, the elastic modulus of the device layer 20 may be higher than the elastic modulus of the carrier 12. For example, the elastic modulus of the device layer 20 is more than 1 time, more typically more than 2 times, and more preferably more than 4 times the elastic modulus of the carrier 12. Examples of this aspect include a case where the device layer 20 (for example, the mold layer 20*c*) comprises ceramic. In this case, the release of the carrier 12 can be preferably performed without allowing the reinforcing material to abut the device layer 20. However, it is needless to say that also in this aspect, the carrier 12 may be released after the reinforcing material is allowed to abut the device layer 20.

(5) Removal of Metal Layer (Optional Step)

Optionally, the metal layer 16 exposed after the release of the carrier 12 is etched away. Thus, the embedded wiring is exposed, which is more suitable for forming a further circuit thereon by a photolithography process. The etching of the metal layer 16 should be performed based on a known method and is not particularly limited.

Wiring Substrate Material

According to a preferred aspect of the present invention, there is provided the wiring substrate 22 (wiring substrate material) comprising the carrier-attached metal foil 18 and the device layer 20 provided on the carrier-attached metal foil 18. In this wiring substrate 22, the outer edge portion of the carrier-attached metal foil 18 is missing in at least one place along at least one line passing through the inside of the contour of the device layer 20 when the wiring substrate 22 is seen in a planar view (see FIG. 1B(iii)). Thus, in the wiring substrate 22, part of the surface of the device layer 20 on the carrier-attached metal foil 18 side is exposed to form the pressurizable exposed portion P for promoting the release of the carrier 12 (and the intermediate layer 14 when present) (see FIG. 1A(iii)). According to such a wiring substrate 22, damage to the device layer 20 during the release of the carrier 12 (and the intermediate layer 14 when present) can be suppressed, and a photolithography process can be carried out with good accuracy on the device layer 20 after the release.

The wiring substrate 22 (wiring substrate material) may be manufactured by any method. Typically, the wiring substrate 22 corresponds to the laminated sheet 10 after the pressurizable exposed portions P are formed on the device layer 20, and before the carrier 12 is released, in the method for manufacturing a wiring substrate described above. Therefore, in the wiring substrate 22, for example, the configuration as shown in FIG. 1A(iii) and FIG. 1B(iii) can be adopted. The device layer 20 included in the wiring substrate 22 is as described above.

Carrier-Attached Metal Foil

As described above with reference to FIG. 1A, the carrier-attached metal foil 18 optionally used in the method of the present invention comprises the carrier 12, optionally the intermediate layer 14, the release layer 15, and the metal layer 16 in order.

As described above, the material of the carrier 12 may be any of glass, ceramic, silicon, a resin, and a metal. Preferably, the carrier 12 is composed of glass, single crystal silicon, polycrystalline silicon, or ceramic. The form of the carrier 12 may be any of a sheet, a film, and a plate. The carrier 12 may be a laminate of these sheets, films, plates, and the like. For example, the carrier 12 may be one that can function as a support having rigidity, such as a glass plate, a ceramic plate, a silicon wafer, or a metal plate, or may be in the form of having no rigidity, such as a metal foil or a resin film. Preferred examples of the metal constituting the carrier 12 include copper, titanium, nickel, stainless steel, and aluminum. Preferred examples of the ceramic include alumina, zirconia, silicon nitride, aluminum nitride, and various other fine ceramics. Preferred examples of the resin include polyethylene terephthalate (PET), polyethylene naphthalate (PEN), polyamides, polyimides, nylons, liquid crystal polymers, polyetheretherketone (PEEK (C)), polyamide-imides, polyethersulfone, polyphenylene sulfide, polytetrafluoroethylene (PTFE), and ethylene tetrafluoroethylene (ETFE). More preferably, from the viewpoint of preventing the warpage of a coreless support accompanying heating when mounting an electronic device, the carrier 12 is a material having a coefficient of thermal expansion (CTE) of less than 25 ppm/K (typically 1.0 ppm/K or more and 23 ppm/K or less). Examples of such a material include various resins (particularly low thermal expansion resins such as polyimides and liquid crystal polymers), glass, single crystal silicon, polycrystalline silicon, and ceramics as described above. From the viewpoint of handleabililty and ensuring flatness during chip mounting, the carrier 12 preferably has a Vickers hardness of 100 HV or more, more preferably 150 HV or more and 2500 HV or less. As a material satisfying these characteristics, the carrier 12 is preferably composed of glass, silicon, or ceramic, more preferably glass or ceramic, and particularly preferably glass. Examples of the carrier 12 composed of glass include a glass plate. When glass is used as the carrier 12, advantages are that it is lightweight, has a low coefficient of thermal expansion, has high insulating properties, and is rigid and has a flat surface and therefore the surface of the metal layer 16 can be extremely smoothed. In addition, when the carrier 12 is glass, advantages are that it has surface flatness (coplanarity) advantageous for fine circuit formation, that it has chemical resistance in desmear and various plating steps in a wiring manufacturing process, and that a chemical separation method can be adopted when the carrier 12 is released from the carrier-attached metal foil 18. Preferred examples of the glass constituting the carrier 12 include quartz glass, borosilicate glass, alkali-free glass, soda lime glass, aluminosilicate glass, and combinations thereof, more preferably alkali-free glass, soda lime glass, and combinations thereof, and particularly preferably alkali-free glass. The alkali-free glass is glass containing substantially no alkali metals that comprises silicon dioxide, aluminum oxide, boron oxide, and alkaline earth metal oxides such as calcium oxide and barium oxide as main components and further contains boric acid. An advantage of this alkali-free glass is that it has a low coefficient of thermal expansion in the range of 3 ppm/K or more and 5 ppm/K or less and is stable in a wide temperature zone of 0° C. to 350° C., and therefore the warpage of the glass in a process involving heating can be minimized. The thickness of the carrier 12 is preferably 100 μm or more and 2000 μm or less, more preferably 300 μm or more and 1800 μm or less, and further preferably 400 μm or more and 1100 μm or less. When the carrier 12 has a thickness within such a range, the thinning of wiring, and the reduction of warpage that occurs during electronic component mounting can be achieved while suitable strength that does not hinder handling is ensured.

The intermediate layer 14 provided as desired may have a one-layer configuration or a configuration of two or more layers. When the intermediate layer 14 is composed of two or more layers, the intermediate layer 14 comprises a first intermediate layer provided directly on the carrier 12, and a second intermediate layer provided adjacent to the release layer 15. The first intermediate layer is preferably a layer composed of at least one metal selected from the group consisting of Ti, Cr, Al, and Ni, in terms of ensuring adhesion to the carrier 12. The first intermediate layer may be a pure metal or an alloy. The thickness of the first intermediate layer is preferably 5 nm or more and 500 nm or less, more preferably 10 nm or more and 300 nm or less, further preferably 18 nm or more and 200 nm or less, and particularly preferably 20 nm or more and 100 nm or less. The second intermediate layer is preferably a layer composed of Cu, in terms of controlling the release strength between the second intermediate layer and the release layer 15 at the desired value. The thickness of the second intermediate layer is preferably 5 nm or more and 500 nm or less, more preferably 10 nm or more and 400 nm or less, further preferably 15 nm or more and 300 nm or less, and particularly preferably 20 nm or more and 200 nm or less. Another interposed layer may be present between the first intermediate layer and the second intermediate layer, and examples of the constituent material of the interposed layer include alloys of at least one metal selected from the group consisting of Ti, Cr, Mo, Mn, W, and Ni, and Cu. On the other hand, when the intermediate layer 14 has a one-layer configuration, the first intermediate layer may be adopted as the intermediate layer as it is, or the first intermediate layer and the second intermediate layer may be replaced by one intermediate alloy layer. This intermediate alloy layer is preferably composed of a copper alloy in which the content of at least one metal selected from the group consisting of Ti, Cr, Mo, Mn, W, Al, and Ni is 1.0 at % or more, and the Cu content is 30 at % or more. The thickness of the intermediate alloy layer is preferably 5 nm or more and 500 nm or less, more preferably 10 nm or more and 400 nm or less, further preferably 15 nm or more and 300 nm or less, and particularly preferably 20 nm or more and 200 nm or less. The thicknesses of layers described above are values measured by analyzing a layer cross section by a transmission electron microscope-energy dispersive X-ray spectrometer (TEM-EDX). The metal constituting the intermediate layer 14 may comprise unavoidable impurities due to the raw material component, the film formation step, and the like. In the case of exposure to the air after the film formation of the intermediate layer 14, the presence of oxygen mixed due to the exposure is allowed, which is not particularly limited. The intermediate layer 14 may be manufactured by any method but is particularly preferably a layer formed by a magnetron sputtering method using a metal target, in terms of being able to have the uniformity of film thickness distribution.

The release layer 15 is a layer that allows or facilitates the release of the carrier 12, and the intermediate layer 14 when it is present. The release layer 15 may be either of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides or metal oxynitrides comprising at least one or more of Cu, Ti, Al, Nb, Zr, Cr, W, Ta, Co, Ag, Ni, In, Sn, Zn, Ga, and Mo, or carbon. Among these, the release layer 15 is preferably a layer mainly comprising carbon, in terms of ease of release, film-forming properties, and the like, more preferably a layer mainly composed of carbon or a hydrocarbon, and further preferably a layer composed of amorphous carbon, a hard carbon film. In this case, the release layer 15 (that is, a carbon-containing layer) preferably has a carbon concentration of 60 atomic % or more, more preferably 70 atomic % or more, further preferably 80 atomic % or more, and particularly preferably 85 atomic % or more as measured by XPS. The upper limit value of the carbon concentration is not particularly limited and may be 100 atomic % but is practically 98 atomic % or less. The release layer 15 can comprise unavoidable impurities (for example, oxygen, carbon, and hydrogen derived from the surrounding environment such as an atmosphere). In the release layer 15, atoms of metals of types other than the metal contained as the release layer 15 can be mixed due to the film formation method of the metal layer 16 or the like laminated later. When a carbon-containing layer is used as the release layer 15, the interdiffusivity and reactivity with the carrier are low, and even if the carrier-attached metal foil 18 is subjected to pressing at a temperature of more than 300° C., the formation of metallic bonds between the metal layer and the bonding interface due to high temperature heating can be prevented to maintain a state in which the release and removal of the carrier is easy. The release layer 15 is preferably a layer formed by a vapor phase method such as sputtering, in terms of suppressing excessive impurities in the release layer 15, and in terms of the continuous productivity of other layers, and the like. The thickness when a carbon-containing layer is used as the release layer 15 is preferably 1 nm or more and 20 nm or less, more preferably 1 nm or more and 10 nm or less. This thickness is a value measured by analyzing a layer cross section by a transmission electron microscope-energy dispersive X-ray spectrometer (TEM-EDX).

The release layer 15 may comprise each layer of a metal oxide layer and a carbon-containing layer or be a layer comprising both a metal oxide and carbon. Particularly, when the carrier-attached metal foil 18 comprises the intermediate layer 14, the carbon-containing layer can contribute to the stable release of the carrier 12, and the metal oxide layer can suppress the diffusion of the metal elements derived from the intermediate layer 14 and the metal layer 16, accompanying heating. As a result, even after the carrier-attached metal foil 18 is heated at a temperature as high as, for example, 350° C. or more, stable releasability can be maintained. The metal oxide layer is preferably a layer comprising an oxide of metals composed of Cu, Ti, Al, Nb, Zr, Cr, W, Ta, Co, Ag, Ni, In, Sn, Zn, Ga, Mo, and combinations thereof. The metal oxide layer is particularly preferably a layer formed by a reactive sputtering method in which sputtering is performed under an oxidizing atmosphere, using a metal target, in terms of being able to easily control film thickness by the adjustment of film formation time. The thickness of the metal oxide layer is preferably 0.1 nm or more and 100 nm or less. The upper limit value of the thickness of the metal oxide layer is more preferably 60 nm or less, further preferably 30 nm or less, and particularly preferably 10 nm or less. This thickness is a value measured by analyzing a layer cross section by a transmission electron microscope-energy dispersive X-ray spectrometer (TEM-EDX). At this time, the order in which the metal oxide layer and the carbon layer are laminated as the release layer 15 is not particularly limited. The release layer 15 may be present in a state of a mixed phase in which the boundary between the metal oxide layer and the carbon-containing layer is not clearly identified (that is, a layer comprising both a metal oxide and carbon).

Similarly, from the viewpoint of maintaining stable releasability even after heat treatment at high temperature, the release layer 15 may be a metal-containing layer in which the surface on the side adjacent to the metal layer 16 is a fluorination-treated surface and/or a nitriding-treated surface. In the metal-containing layer, a region in which the sum of the content of fluorine and the content of nitrogen is 1.0 atomic % or more (hereinafter referred to as a "(F+N) region") is preferably present over a thickness of 10 nm or more, and the (F+N) region is preferably present on the metal layer 16 side of the metal-containing layer. The thickness (in terms of $SiO_2$) of the (F+N) region is a value specified by performing the depth profile elemental analysis of the carrier-attached metal foil 18 using XPS. The fluorination-treated surface or the nitriding-treated surface can be preferably formed by Reactive ion etching (RIE) or a reactive sputtering method. On the other hand, the metal element included in the metal-containing layer preferably has a negative standard electrode potential. Preferred examples of the metal element included in the metal-containing layer include Cu, Ag, Sn, Zn, Ti, Al, Nb, Zr, W, Ta, Mo, and combinations thereof (for example, alloys and intermetallic compounds). The content of the metal element in the metal-containing layer is preferably 50 atomic % or more and 100 atomic % or less. The metal-containing layer may be a single layer composed of one layer or a multilayer composed of two or more layers. The thickness of the entire metal-containing layer is preferably 10 nm or more and 1000 nm or less, more preferably 30 nm or more and 500 nm or less, further preferably 50 nm or more and 400 nm or less, and particularly preferably 100 nm or more and 300 nm or less. The thickness of the metal-containing layer itself is a value measured by analyzing a layer cross section by a transmission electron microscope-energy dispersive X-ray spectrometer (TEM-EDX).

Alternatively, the release layer 15 may be a metal oxynitride-containing layer, instead of a carbon layer or the like.

The surface of the metal oxynitride-containing layer opposite to the carrier 12 (that is, on the metal layer 16 side) preferably comprises at least one metal oxynitride selected from the group consisting of TaON, NiON, TiON, NiWON, and MoON. In terms of ensuring the adhesion between the carrier 12 and the metal layer 16, the surface of the metal oxynitride-containing layer on the carrier 12 side preferably comprises at least one selected from the group consisting of Cu, Ti, Ta, Cr, Ni, Al, Mo, Zn, W, TiN, and TaN. Thus, the number of foreign matter particles on the metal layer 16 surface is suppressed to improve circuit-forming properties, and even after heating at high temperature for a long time, stable release strength can be maintained. The thickness of the metal oxynitride-containing layer is preferably 5 nm or more and 500 nm or less, more preferably 10 nm or more and 400 nm or less, further preferably 20 nm or more and 200 nm or less, and particularly preferably 30 nm or more and 100 nm or less. This thickness is a value measured by analyzing a layer cross section by a transmission electron microscope-energy dispersive X-ray spectrometer (TEM-EDX).

The metal layer 16 is a layer composed of a metal. The metal layer 16 may have a one-layer configuration or a configuration of two or more layers. When the metal layer 16 is composed of two or more layers, the metal layer 16 can have a configuration in which metal layers, a first metal layer to an m-th metal layer (m is an integer of 2 or more), are laminated in order on the surface side of the release layer 15 opposite to the carrier 12. The thickness of the entire metal layer 16 is preferably 1 nm or more and 2000 nm or less, preferably 100 nm or more and 1500 nm or less, more preferably 200 nm or more and 1000 nm or less, further preferably 300 nm or more and 800 nm or less, and particularly preferably 350 nm or more and 500 nm or less. The thickness of the metal layer 16 is a value measured by analyzing a layer cross section by a transmission electron microscope-energy dispersive X-ray spectrometer (TEM-EDX). An example in which the metal layer 16 is composed of two layers, a first metal layer and a second metal layer, will be described below.

The first metal layer preferably provides the desired functions such as an etching stopper function and an antireflection function to the carrier-attached metal foil 18. Preferred examples of the metal constituting the first metal layer include Ti, Al, Nb, Zr, Cr, W, Ta, Co, Ag, Ni, Mo, and combinations thereof, more preferably Ti, Zr, Al, Cr, W, Ni, Mo, and combinations thereof, further preferably Ti, Al, Cr, Ni, Mo, and combinations thereof, and particularly preferably Ti, Mo, and combinations thereof. These elements have the property of not dissolving in flash etchants (for example, copper flash etchants) and, as a result, can exhibit excellent chemical resistance to flash etchants. Therefore, the first metal layer is a layer less likely to be etched with a flash etchant than the second metal layer described later, and therefore can function as an etching stopper layer. In addition, the metal constituting the first metal layer also has the function of preventing the reflection of light, and therefore the first metal layer can also function as an antireflection layer for improving visibility in image inspection (for example, automatic image inspection (AOI)). The first metal layer may be a pure metal or an alloy. The metal constituting the first metal layer may comprise unavoidable impurities due to the raw material component, the film formation step, and the like. The upper limit of the content of the metal is not particularly limited and may be 100 atomic %. The first metal layer is preferably a layer formed by a physical vapor deposition (PVD) method, more preferably a layer formed by sputtering. The thickness of the first metal layer is preferably 1 nm or more and 500 nm or less, more preferably 10 nm or more and 400 nm or less, further preferably 30 nm or more and 300 nm or less, and particularly preferably 50 nm or more and 200 nm or less.

Preferred examples of the metal constituting the second metal layer include the transition elements of groups 4, 5, 6, 9, 10, and 11, Al, and combinations thereof (for example, alloys and intermetallic compounds), more preferably the transition elements of groups 4 and 11, Al, Nb, Co, Ni, Mo, and combinations thereof, further preferably the transition elements of group 11, Ti, Al, Mo, and combinations thereof, particularly preferably Cu, Ti, Mo, and combinations thereof, and most preferably Cu. The second metal layer may be manufactured by any method and may be a metal foil formed, for example, by wet film formation methods such as an electroless metal plating method and an electrolytic metal plating method, physical vapor deposition (PVD) methods such as sputtering and vacuum deposition, chemical vapor film formation, or combinations thereof. A particularly preferred second metal layer is a metal layer formed by physical vapor deposition (PVD) methods such as a sputtering method and vacuum deposition, most preferably a metal layer manufactured by a sputtering method, from the viewpoint of being easily adapted to a fine pitch due to superthinning. The second metal layer is preferably a non-roughened metal layer, but may be one in which secondary roughening occurs by preliminary roughening, soft etching treatment, rinse treatment, or oxidation-reduction treatment, as long as wiring pattern formation is not hindered. From the viewpoint of being adapted to a fine pitch, the thickness of the second metal layer is preferably 10 nm or more and 1000 nm or less, more preferably 20 nm or more and 900 nm or less, further preferably 30 nm or more and 700 nm or less, still more preferably 50 nm or more and 600 nm or less, particularly preferably 70 nm or more and 500 nm or less, and most preferably 100 nm or more and 400 nm or less. The metal layer having a thickness within such a range is preferably manufactured by a sputtering method from the viewpoint of the in-plane uniformity of film formation thickness, and productivity in a sheet form or a roll form. When the metal layer 16 has a one-layer configuration, the second metal layer is preferably adopted as the metal layer 16 as it is. On the other hand, when the metal layer 16 has an n-layer (n is an integer of 3 or more) configuration, the first metal layer to (n-1)th metal layer of the metal layer 16 preferably have the configuration of the first metal layer, and the outermost layer, that is, the n-th metal layer, of the metal layer 16 preferably has the configuration of the second metal layer.

The end surface of the carrier 12 is preferably covered by extending the metal layer 16, optionally the intermediate layer 14, and optionally the release layer 15 (that is, at least the metal layer 16, for example, the metal layer 16 and the intermediate layer 14) to the end surface. In other words, not only a surface of the carrier 12 but also the end surface is preferably covered with at least the metal layer 16. By also covering the end surface, the infiltration of chemical liquids into the carrier 12 in the wiring substrate manufacturing process can be prevented, and in addition, it is possible to strongly prevent chipping, that is, a chip in the film (that is, the metal layer 16) on the release layer 15, due to release at the side end when the carrier-attached metal foil 18 or the laminated sheet 10 is handled. The covered region on the end surface of the carrier 12 is preferably a region 0.1 mm or more, more preferably 0.2 mm or more, from the surface of the carrier 12 toward the thickness direction (that is, the direction perpendicular to the carrier surface) and is further preferably throughout the end surface of the carrier 12.

The invention claimed is:

1. A method for manufacturing a wiring substrate, comprising:

providing a laminated sheet comprising a release layer, a metal layer, and a device layer in order on a carrier;

making a cut line from a surface of the laminated sheet on a carrier side so that the cut line passes through an inside of a contour of the device layer and both ends of the cut line reach an end of the laminated sheet when the laminated sheet is seen in a planar view, and so as to pass through the carrier, the release layer, and the metal layer when the laminated sheet is seen in a cross-sectional view; and removing outer edge portions outside the cut line in the carrier, the release layer, and the metal layer, thereby exposing part of a surface of the device layer on a metal layer side to form a pressurizable exposed portion for promoting release of the carrier.

2. The method according to claim 1, wherein the laminated sheet has an extending portion in which the metal layer projects from an end of the device layer when the laminated sheet is seen in a planar view, the method further comprising previously cutting the metal layer along the contour of the device layer in the extending portion before making the cut line.

3. The method according to claim 1, further comprising releasing the carrier from the laminated sheet at a position of the release layer after removal of the outer edge portions.

4. The method according to claim 3, wherein the release of the carrier comprises applying force to the pressurizable exposed portion of the device layer in a direction in which the device layer is pulled away from the carrier, in a state in which the carrier is fixed.

5. The method according claim 3, wherein the pressurizable exposed portions are formed in at least two places by providing the cut lines in at least two places, and wherein the release of the carrier is performed by applying force to the pressurizable exposed portions in the at least two places in the direction in which the device layer is pulled away from the carrier.

6. The method according to claim 5, wherein the release of the carrier is performed by applying force in a direction in which the device layer is pulled away in a direction perpendicular to a surface defined by the carrier.

7. The method according to claim 3, further comprising the step of etching away the metal layer exposed after the release of the carrier.

8. The method according to claim 1, wherein the cut line is provided so as to pass through a region 0.5 mm or more and 30.0 mm or less inside the contour of the device layer when the laminated sheet is seen in a planar view.

9. The method according to claim 1, wherein the cut line is provided so that the pressurizable exposed portion has a polygonal shape or an arc shape.

10. The method according to claim 1, wherein the device layer comprises a wiring layer, an electronic device provided on the wiring layer, and a mold layer surrounding the wiring layer and the electronic device, and wherein the cut line is provided so as to cross the mold layer without crossing the wiring layer and the electronic device when the laminated sheet is seen in a planar view.

11. The method according to claim 1, wherein an elastic modulus of the device layer is lower than an elastic modulus of the carrier.

12. The method according to claim 11, wherein the device layer comprises a resin.

13. The method according to claim 1, wherein an elastic modulus of the device layer is higher than an elastic modulus of the carrier.

14. The method according to claim 13, wherein the device layer comprises ceramic.

15. The method according to claim 1, wherein the carrier is a glass carrier.

16. The method according to claim 1, wherein the carrier has a disk shape having a diameter of 100 mm or more, or a rectangular shape having a short side of 100 mm or more.

17. The method according to claim 1, wherein provision of the laminated sheet comprises:

providing a carrier-attached metal foil comprising a release layer and a metal layer on a carrier;

forming a first wiring layer on a surface of the metal layer; and building the device layer based on the first wiring layer.

18. A wiring substrate material comprising a release layer, a metal layer, and a device layer in order on a carrier, wherein outer edge portions of the carrier, the release layer, and the metal layer are missing in at least one place along at least one line passing through an inside of a contour of the device layer when the wiring substrate material is seen in a planar view, whereby part of a surface of the device layer on a metal layer is exposed.

* * * * *